(12) United States Patent
Yun et al.

(10) Patent No.: US 8,518,277 B2
(45) Date of Patent: Aug. 27, 2013

(54) PLASTIC CAPACITIVE TOUCH SCREEN AND METHOD OF MANUFACTURING SAME

(75) Inventors: Yang Yun, Zeeland, MI (US); Ryan T. Gerlach, Holland, MI (US)

(73) Assignee: TPK Touch Solutions Inc., Taipei (TW)

( * ) Notice: Subject to any disclaimer, the term of this patent is extended or adjusted under 35 U.S.C. 154(b) by 577 days.

(21) Appl. No.: 12/704,133

(22) Filed: Feb. 11, 2010

(65) Prior Publication Data
US 2010/0200539 A1    Aug. 12, 2010

Related U.S. Application Data

(60) Provisional application No. 61/151,977, filed on Feb. 12, 2009.

(51) Int. Cl.
*C23F 1/02* (2006.01)
(52) U.S. Cl.
USPC ............... 216/13; 216/83; 438/689; 345/173; 345/174; 345/175; 345/176; 345/177; 345/178; 257/E23.144
(58) Field of Classification Search
USPC ............. 216/13, 83; 438/689; 345/173–178; 257/E23.144
See application file for complete search history.

(56) References Cited

U.S. PATENT DOCUMENTS

| | | | |
|---|---|---|---|
| 6,639,178 B2 * | 10/2003 | Kupisiewicz | 219/121.69 |
| 2002/0086188 A1 * | 7/2002 | Halsey et al. | 428/697 |
| 2002/0110944 A1 * | 8/2002 | Kian et al. | 438/30 |
| 2004/0063326 A1 * | 4/2004 | Szlufcik et al. | 438/695 |
| 2008/0180399 A1 * | 7/2008 | Cheng | 345/173 |
| 2008/0210660 A1 * | 9/2008 | Stockum et al. | 216/13 |
| 2009/0095706 A1 * | 4/2009 | Hauch et al. | 216/13 |

* cited by examiner

*Primary Examiner* — Lan Vinh
*Assistant Examiner* — David Kaufman
(74) *Attorney, Agent, or Firm* — Gokalp Bayramoglu; Anna Tsang

(57) ABSTRACT

A method of removing portions of a conductive layer comprising a transparent conductive material and/or a metallic material disposed on a plastic substrate used for capacitive touchscreen devices includes providing a plastic substrate having a conductive layer disposed on a surface thereof and removing portions of the conductive layer at the surface of the plastic substrate to establish a pattern of electrically isolated conductive portions on the surface of the plastic substrate. The conductive portions or traces are electrically connected to a touchscreen controller, which is operable to determine a location of a touch or proximity of an object at or near the surface of the plastic substrate responsive to a detected change in capacitance. The removal process may comprise etching or laser ablating portions of the conductive layer at the surface of the plastic substrate.

26 Claims, 2 Drawing Sheets

PLASTIC CAPACITIVE TOUCH SCREEN AND METHOD OF MANUFACTURING SAME

CROSS REFERENCE TO RELATED APPLICATION

The present application claims the benefit of U.S. provisional application Ser. No. 61/151,977, filed Feb. 12, 2009, which is hereby incorporated herein by reference in its entirety.

FIELD OF THE INVENTION

The present invention relates generally to touch sensors or touchscreens.

BACKGROUND OF THE INVENTION

Various touchscreens or sensors are known. Examples of known touch sensors or touchscreens and coatings implemented on such touch sensors or touchscreens are described in U.S. Pat. Nos. 6,488,981; 6,549,193; 6,727,895; and 6,842,171, which are hereby incorporated herein by reference in their entireties.

Typically, a capacitive touchscreen is distinguished from resistive touchscreen by its higher clarity and its capability of supporting multitouch functions, which allows users to control graphical applications with several fingers. Such multitouch devices may allow multiple users to interact with the touchscreen simultaneously. Particularly attractive are capacitive touchscreens made on plastics for the production of ultra-thin, lightweight, flexible and low power consumption displays, which may appear as electric books and electric newspapers and even paper-thin wall-mounted televisions. However, for such plastic touchscreen applications, the manufacturing temperatures of the devices cannot exceed the plastic glass transition temperature ($T_g$), which is typically less than about 150 degrees C. for most suitable optical plastics, because of the warp and melt that occurs when such plastic substrates are exposed to elevated temperatures.

SUMMARY OF THE INVENTION

The present invention provides a cost-effective method for producing plastic capacitive touchscreen displays. The present invention also provides a method to remove a transparent conductive material and/or metallic material on a plastic substrate during manufacturing of a plastic capacitive touchscreen display.

The present invention may provide a plastic capacitive touchscreen device and method of forming a plastic capacitive touchscreen device in which the manufacturing steps are simplified. For example, the present invention may provide a plastic capacitive touchscreen and method of forming a plastic capacitive touchscreen device in which a removal step (such as, for example, application of a caustic etchant paste or the like, or laser ablation or the like) is used to remove portions of the conductive layer or layers, such as a layer or layers of a transparent conductive material or a layer or layers of a metallic material or the like, disposed at or on a plastic substrate (such as a rigid plastic substrate) to electrically isolate regions of the transparent conductive material or layer or layers and/or metallic material or layer or layers on the plastic substrate from electrical power and/or signal traces or to electrically isolate electrical power traces from electrical signal traces. The method of the present invention includes electrically connecting the conductive portions or traces of the transparent conductive material and/or metallic material on the surface of the plastic substrate to a touchscreen controller, which is operable to determine a location of a touch or proximity of an object (such as a stylus or a finger or fingernail or the like) at or near the surface of the plastic substrate responsive to a detected change in capacitance of the coated substrate.

These and other objects, advantages, purposes and features of the present invention will become more apparent upon review of the following specification in conjunction with the drawing.

DESCRIPTION OF THE PREFERRED EMBODIMENTS

Figure 1:
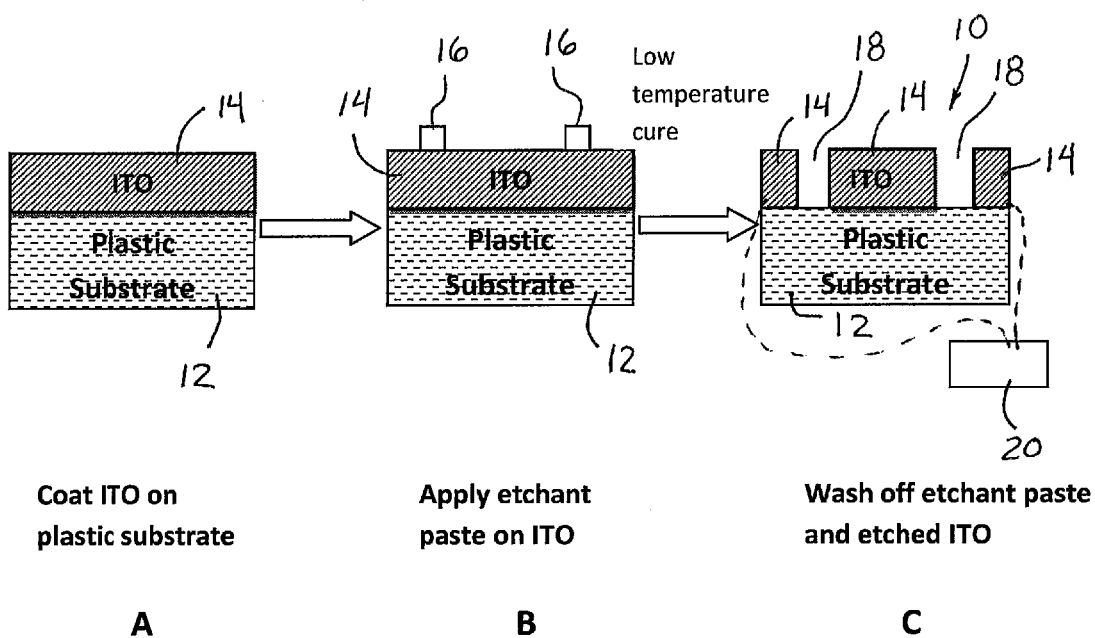
FIG. 1 is a process for forming a coated and etched touchscreen substrate in accordance with the present invention.

Referring now to the drawings and the illustrative embodiments depicted therein, a touch sensor 10 manufactured in accordance with the present invention as shown in FIG. 1. In the illustrated embodiment, the touch sensor includes a rigid or flexible substrate 12 (such as a plastic or polymeric substrate or the like) with a conductive layer 14 (such as a transparent conductive coating or layer comprising a transparent conductive material such as a transparent conductive overcoat (TCO) or indium tin oxide (ITO) or the like) disposed on a surface thereof (see A in FIG. 1). A pattern 18 is established in or at or through the transparent conductive layer via a removal process to electrically isolate portions of the conductive layer on the plastic substrate. For example, and as shown in FIG. 1, an etchant paste 16 is disposed on the conductive layer in a pattern (see B in FIG. 1), and the etchant paste is washed off the substrate after the paste has etched the pattern 18 into the conductive layer 14 (see C in FIG. 1). The capacitive touch sensor or touchscreen device may comprise or be suitable for any capacitive touchscreen devices or applications, such as devices that can detect the presence and location of a touch within a device area by detecting a capacitance variation. The ITO removal procedures shown in FIG. 1 use etching paste on the plastic substrate. The removal or etchant process is desirably performed at a temperature lower than the plastic glass transition temperature ($T_g$) to limit or substantially preclude warping of the potentially or possibly or relatively delicate plastic substrate.

The plastic sheet or substrate is coated with a thin film/layer of transparent conductive material that conducts a continuous electrical current across the plastic capacitive touchscreen sensor. Typically, some manufacturing processes may delete the transparent conductive materials from glass substrates at selective or selected regions of a coated substrate to electrically insulate or provide insulation between the transparent conductive material layer and electrical power and/or signal traces or to electrically insulate or provide insulation between the electrical power traces and electrical signal traces. High temperature transparent conductive material removal methods are undesirable because they include heating the coated substrate to temperatures (such as up to about 200 degrees C. or thereabouts or lower or greater temperatures) higher than plastic glass transition temperatures ($T_g$s) of many of the suitable or selected plastics for the substrate. The present invention introduces a new transparent conductive material removal method by using etchant paste to take off or remove or etch the transparent conductive material on the plastic substrate for use in plastic capacitive touchscreen manufacturing.

The present invention, in accordance with an aspect thereof, provides a method of removing portions of or etching a conductive layer or material (such as a transparent conductive material) on a plastic substrate during the manufacture of a capacitive touchscreen device (and may provide such a method suitable for use on a rigid plastic substrate (such as, for example, a plastic substrate having a thickness of at least 0.3 mm and more preferably at least 0.5 mm) for a plastic capacitive touchscreen device). The method includes providing a coated plastic substrate (coated on at least a portion of at least one surface of the plastic substrate by a conductive coating, such as a transparent conductive coating, such as a coating or layer of indium tin oxide or the like), applying a paste (which may contain a caustic etchant material or property or characteristic) to the surface of a transparent conductive material coating or layer, carrying out a thermal processing step to etch a part or a layer of the transparent conductive material where the paste has been applied, and then rinsing off the etchant paste and etched transparent conductive material.

The etchant paste may be applied selectively to a major surface of the transparent conductive material layer to form a pattern of applied paste. The paste may be applied, for example, by a selective deposition process or method, or a printing process or method such as, for example, screen printing and/or the like.

The present invention also provides an etchant paste suitable for selective deposition onto a substrate to be etched. The plastic substrate may comprise a transparent conductive material thin film disposed on a surface thereof. The etchant paste may preferably be adapted to be used in a selective deposition method such as screen printing or the like. This adaptation may be related to the viscosity of the paste at application temperatures, such as, for example, at room temperature. Optionally, the etchant paste may comprise a caustic etching agent, such as, for example, a basic or alkaline etching agent, such as, for example, potassium hydroxide (KOH), sodium hydroxide (NaOH), ammonium hydroxide ($NH_4OH$) or combinations or derivatives of these. The etchant paste may comprise a natural or synthetic etching paste. Optionally, and desirably, the etchant paste may be water-based.

The etchant paste may be thermally activated and may etch the substrate coating at a high rate only above an elevated temperature, such as, for example, above an elevated temperature that is at or above about 50 degrees C. or thereabouts or above so that room temperature application does not cause the reaction to start immediately. The method of the present invention may include carrying out a thermal processing step (such as by heating the coated substrate with etchant disposed thereon to a selected elevated temperature) to etch a part or a layer of the substrate where the paste has been applied. Such a thermal processing step may comprise a treatment performed at room temperature or any elevated temperature below the plastic substrate's glass transition temperature. Optionally, the treatment may comprise exposing the substrate and etchant paste to infrared light, ultraviolet light, visible light, or no light.

Optionally, the method of the present invention may include doping a region of the transparent conductive material before applying the etchant paste, whereby the etchant paste may then be applied to the doped region of the transparent conductive material. The transparent conductive material and the doped region are part of the capacitive touchscreen device. The transparent conductive material may have major surfaces and edges and the etchant paste may be applied at least to the edges of the transparent conductive material.

The touchscreen and method of the present invention includes electrically connecting the conductive portions or traces of the conductive material on the surface of the plastic substrate to a touchscreen controller 20. The touchscreen controller 20 is operable to determine a location of a touch or proximity of an object (such as a stylus or a finger or fingernail or the like) at or near the coated and patterned surface of the plastic substrate responsive to a detected change in capacitance of the coated substrate. The touchscreen may be disposed at or over a display, whereby the controller may determine the location of a touch or proximity of an object and control or execute a function shown on the display at the detected location, such as by utilizing known touchscreen and display technology.

Thus, the present invention may include providing a thin film or layer of a conductive material 14, such as a transparent conductive material such as ITO or the like, that is deposited on a surface of a plastic substrate 12 (see A in FIG. 1). The etchant paste 16 may then be screen-printed on or over on the ITO thin film 14 (see B in FIG. 1) at selected regions. The coated substrate with etchant paste established thereon is then kept at a generally or substantially constant temperature (such as a temperature above room temperature but below about 150 degrees C. or thereabouts) for a predetermined or selected or appropriate period of time to allow the paste to etch through the ITO thin film. After the transparent conductive coating is etched the desired or appropriate amount, the etchant paste and etched ITO coated substrate are rinsed off or washed, such as by using water or other suitable washing medium. For example, the rinse processing step may comprise a dip or spray process with or without agitation or ultrasonic wave using water or any other solvent, such as, for example, methanol, ethanol, acetone, or iso-propanol, or combinations thereof. The waste solution from the wash process may then be collected and filtered before disposing into sewage, thereby reducing or substantially eliminating the environmental hazard from the use of the etchant paste.

Figure 2:
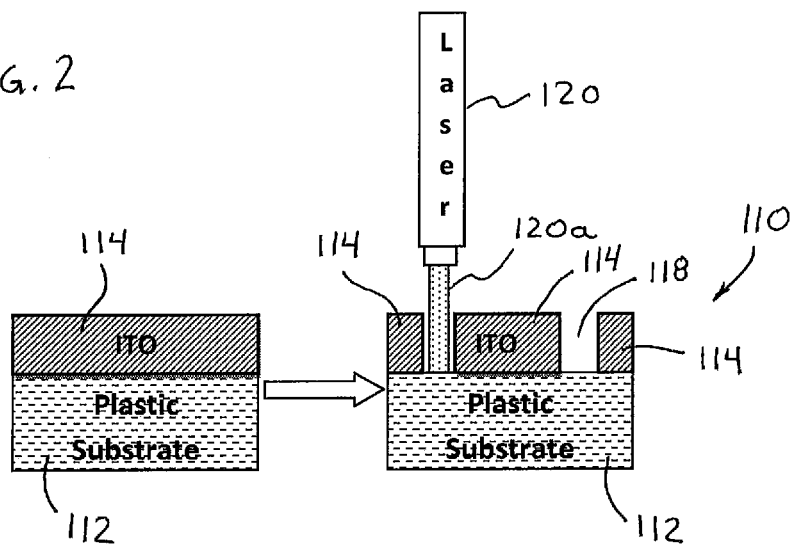
FIG. 2 is a process for forming a coated and laser ablated plastic touchscreen substrate in accordance with the present invention.

Optionally, and with reference to FIG. 2, a touch sensor 110 includes a rigid or flexible substrate 112 (such as a plastic or polymeric substrate or the like) with a conductive layer 114 (such as a transparent conductive coating or layer comprising a transparent conductive overcoat (TCO) or indium tin oxide (ITO) or the like, or such as a metallic material or coating or layer) disposed on a surface thereof. A pattern 118 is established in or at or through the conductive layer 114 via a removal process to electrically isolate portions of the conductive layer on the plastic substrate. In the illustrated embodiment, the removal process comprises laser ablation of portions of the conductive layer in a pattern via a laser device 120 that emits a beam of light or energy 120a at and through the conductive layer 114 (but not into the plastic substrate 112) to establish the pattern 118 into the conductive layer 114. The capacitive touch sensor or touchscreen device may comprise or be suitable for any capacitive touchscreen devices or applications, such as devices that can detect the presence and location of a touch within a device area by detecting a capacitance variation. The laser device 120 is operable to emit or project a beam having a selected wavelength and intensity so as to be able to ablate the conductive coating or layer but without ablating or cutting or marring the surface of the plastic substrate 112. The conductive traces or layers are electrically connected to a touchscreen controller that determines the location of a touch or proximity of an object at or near the surface of the plastic substrate to construct the touchscreen or touch sensor.

Figure 3:
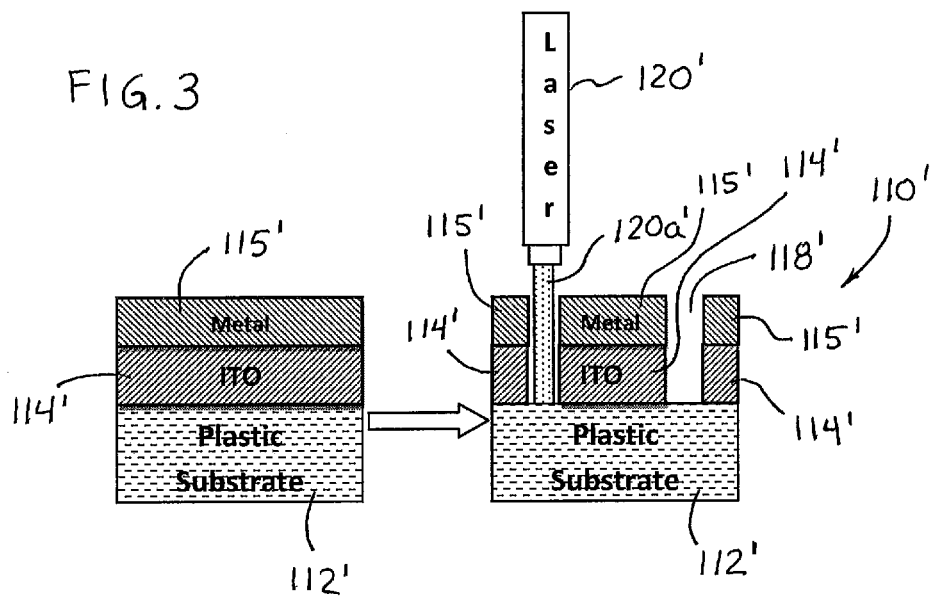
FIG. 3 is a process for forming another coated and laser ablated plastic touchscreen substrate in accordance with the present invention.

Optionally, and with reference to FIG. 3, a touch sensor 110' includes a rigid or flexible substrate 112' (such as a plastic or polymeric substrate or the like) with a transparent conductive layer 114' (such as a coating or layer of transparent conductive overcoat (TCO) or indium tin oxide (ITO) or the like) disposed on a surface thereof, and with a metallic layer or coating 115' (such as an opaque or partially opaque or partially transparent metallic layer or coating, such as, for example, a copper layer or coating, a chromium layer or coating, a niobium layer or coating, a neodymium layer or coating, a silver layer or coating, a molybdenum layer or coating, and/or a layer or coating of alloys of these metals) disposed over and overcoating the transparent conductive layer 114'. Similar to touch sensor 110, discussed above, touch sensor 110' has a pattern 118' established in or at or through the conductive layers (the transparent conductive layer 114' and the metallic layer 115') via laser ablation of portions of the transparent conductive layer 114' and metallic layer 115' in a pattern via a laser device 120' that emits a beam of light or energy 120a' at and through the transparent conductive layer 114' and metallic layer 115' (but not into the plastic substrate 112') to establish the pattern 118' into the transparent conductive layer 114' and metallic layer 115'. The capacitive touch sensor or touchscreen device may comprise or be suitable for any capacitive touchscreen devices or applications, such as devices that can detect the presence and location of a touch within a device area by detecting a capacitance variation. The laser device 120' is operable to emit or project a beam having a selected wavelength and intensity so as to be able to ablate the metallic coating or layer and the transparent conductive coating or layer, but without ablating or cutting or marring the surface of the plastic substrate 112'. The conductive traces or layers are electrically connected to a touchscreen controller that determines the location of a touch or proximity of an object at or near the surface of the plastic substrate to construct the touchscreen or touch sensor.

Optionally, the transparent conductive layer 114' and the metallic layer or coating 115' may be disposed or deposited or applied on different or opposite sides of the plastic substrate. A laser device or the like may ablate portions of the conductive layers or coatings at either or both sides of the plastic substrate to establish the desired or appropriate conductive pattern or trace on the respective surface or surfaces of the plastic substrate. Optionally, the layer or layers disposed at the substrate surface or surfaces may comprise multilayer structures consisting of more than one transparent conductive layer and/or more than one metallic layer, while remaining within the spirit and scope of the present invention.

The transparent conductive material of the touchscreen sensors or substrates of the present invention may comprise conductive and/or semiconductive materials; such as tin oxide, silicon oxide, microcrystalline, polycrystalline or amorphous ITO, antimony tin oxide, zinc oxide, aluminum oxide, carbon nano-tube, microcrystalline, polycrystalline or amorphous carbon; and hydrogen, nitrogen, fluorine or phosphorus doped carbon or any other suitable conductive or semiconductive material/materials. The transparent conductive material or materials may be prepared by any suitable means of thin film preparations, such as, for example, direct current magnetron sputtering, radio frequency magnetron sputtering, chemical vapor deposition, physical vapor deposition, electron beam evaporation, pulsed laser deposition, spray pyrolysis and/or the like. Optionally; the plastic substrate on which the transparent conductive material is disposed may comprise any suitable polymer materials, such as, for example; cyclic olefin, cyclic olefin resins (COC) under the TOPAS trademark, cyclo olefin polymer (COP) under the ZEONOR trademark, polyolefin, polycarbonate, polyethylene terephthalate, acrylic, polyamide, polyimide, polystyrene, polysulfone, polyvinyl chloride, nylon, polyethylene, polypropylene, polyvinyl alcohol and/or the like. For applications that involve a larger substrate size, such as for applications with plastic or polymeric substrates of about 0.5 mm thick or greater than about 0.5 mm thick, the plastic substrate may be molded, since it may be difficult to get COO or COP in large sheets due to difficulties that may arise in extruding such materials at higher thicknesses.

The conductive pattern (established by removing or etching or laser ablating selected lines or areas of the coated rigid or semi-rigid plastic substrate) may be established as discrete pads or conductive portions that may correspond with displayed buttons or indicia displayed by a display device or screen that is disposed behind the substrate such that the displayed buttons or indicia are viewed by a person using the touch sensor through the substrate and through the transparent conductive layer, as discussed below. Optionally, for example, the conductive pattern may be established at a rear surface of the substrate and the touch sensor may sense or detect the presence or touch or proximity of a user's finger (or other object or stylus or the like) at or near or proximate to the front or opposite surface of the substrate (such as by utilizing aspects of projected capacitive sensor technology that is sufficiently sensitive to sense the presence or proximity of an object through the thickness of the substrate, such as a glass or plastic substrate or the like) and at or near regions of the front surface that correspond to selected ones of the discrete pads, whereby the sensor or system, responsive to such a detection, may actuate or control the circuitry or device or display function that corresponds with the selected displayed button or icon or indicia or file or photo image or the like.

The present invention thus provides a method to remove or etch or ablate portions of the conductive film for a plastic capacitive sensor, such as a plastic capacitive sensor having an ITO coating or layer (or other suitable conductive layer or layers) disposed on a rigid plastic substrate or the like, or any other type of plastic capacitive sensor and applicable processes including application of ITO, silver conductors, patterning techniques, and/or the like. It is envisioned that the present invention is suitable for any type of capacitive sensor, such as surface capacitive sensors, discrete pad capacitive sensors, projected capacitive sensors and/or the like.

Optionally, the process of the present invention may incorporate etching of the conductive films via application of an etchant paste and thermal activation of the etchant paste, or the process may incorporate laser ablation of the conductive films (such as via UV light or other suitable light or ablation means) to make a plastic capacitive sensor. Optionally, the process of the present invention may use a silver ink or the like for establishing the plastic capacitive sensor electrode patter. Optionally, the process may include laminating a film or depositing a hard coat, anti-glare or anti-reflective (AR) coating to either the first or second surface of the plastic capacitive sensor. Optionally, a buffer layer (such as a layer comprising silicon dioxide ($SiO_2$) or the like) may be deposited between the plastic substrate and the conductive layer to improve environmental stability of the sensor.

Therefore, the present invention provides a touch sensor or touchscreen that includes discrete pads or conductive portions and traces established at a surface of a plastic substrate via a pattern layer or coating of a transparent conductive material, such as ITO or the like, or a pattern layer or coating of a metallic material or the like, with each of the discrete pads corresponding to a button or buttons of a display screen disposed behind or at the plastic substrate. The touch sensor or system may control or actuate a button or switch in response to detection of a user touching or approaching a portion of the substrate that corresponds to a respective pad or pads at the touch sensor substrate.

In addition to the use of standard ITO coatings or other suitable conductive coatings or layers or films, one or more optical enhancing layers and/or mechanical or durability enhancing layers and/or EMI coatings can be added to or disposed at the surface of the substrate, such as to the front surface coating to adjust the properties (such as the transmissivity properties and/or appearance properties of the sensor) to meet certain customer wants or needs. Such enhancements may include index matching of the layers with air or other media and/or alternating high and low refractive index materials to create various anti-reflective stacks (such as by utilizing aspects of the reflective elements described in U.S. Pat. Nos. 7,274,501; 7,255,451 and/or 7,184,190, and/or U.S. patent application Ser. No. 11/912,576, filed Oct. 25, 2007, now U.S. Pat. No. 7,626,749, which are hereby incorporated herein by reference in their entireties). Optionally, other or alternate materials (to ITO) can be used. For example, such materials may include a flourine-doped tin oxide material or the like, a copper-aluminum material or the like, a zinc oxide or ZnO material or the like, or other non-traditional TCOs if desired or appropriate, while remaining within the spirit and scope of the present invention.

The process and/or finished touch sensor or touchscreen product of the present invention may utilize aspects of the processes and/or products described in U.S. Pat. Nos. 4,490,227; 4,650,557; 4,655,811; 5,725,957; 6,001,486; 6,087,012; 6,440,491; 6,620,454; 6,627,918; 6,706,552; 6,488,981; 6,549,193; 6,727,895; 6,842,171; 6,787,240; and/or 7,165,323; and/or U.S. patent applications, Ser. No. 09/946,228, filed Sep. 5, 2001; Ser. No. 09/974,209, filed Oct. 10, 2001; Ser. No. 10/744,522, filed Dec. 23, 2003; Ser. No. 10/798,171, filed Mar. 11, 2004; Ser. No. 11/218,374, filed Sep. 2, 2005, now U.S. Pat. No. 7,507,438; Ser. No. 11/440,855, filed May 25, 2006; Ser. No. 12/513,960, filed May 7, 2009; Ser. No. 12/663,384, filed Dec. 7, 2009; Ser. No. 12/537,620, filed Aug. 7, 2009; and/or Ser. No. 12/619,907, filed Nov. 17, 2009, and/or PCT Application No. PCT/US08/68987, filed Jul. 2, 2008, and/or PCT Application No. PCT/US08/071034, filed Jul. 24, 2008, which are all hereby incorporated herein by reference in their entireties.

The display device or screen may comprise any suitable display device or screen or module, such as a liquid crystal display device or the like. Optionally, for example, the display device may utilize aspects of the display devices described in U.S. Pat. Nos. 7,004,592; 5,530,240; 6,329,925; 6,690,268; 5,668,663; 5,724,187; 7,195,381; 7,255,451; 7,274,501; 7,446,650; 7,184,190; and/or 7,370,983, and/or U.S. patent applications, Ser. No. 12/091,525, filed Apr. 25, 2008; Ser. No. 10/538,724, filed Jun. 13, 2005; and/or Ser. No. 11/912,576, filed Oct. 25, 2007, now U.S. Pat. No. 7,626,749, which are all hereby incorporated herein by reference in their entireties.

Changes and modifications in the specifically described embodiments may be carried out without departing from the principles of the present invention, which is intended to be limited only by the scope of the appended claims as interpreted according to the principles of patent law.

The invention claimed is:

1. A method of removing portions of a conductive layer disposed at a plastic substrate used for capacitive touchscreen devices, said method comprising:

providing a plastic substrate having a conductive layer disposed on a surface thereof, wherein said conductive layer comprises at least one of a transparent conductive material and a metallic material;

doping at least one region of said conductive layer;

applying an etchant paste to portions of said conductive layer including said at least one doped region removing portions of said conductive layer at said surface of said plastic substrate by performing a thermal processing step to thermally activate said etchant paste to etch said conductive layer at a temperature below a glass transition temperature of said plastic substrate to establish a pattern of electrically isolated conductive portions on said surface of said plastic substrate;

rinsing said etched substrate to wash off said etchant paste and said etched conductive layer from the plastic substrate; and electrically connecting said conductive portions to a touchscreen controller, wherein said touchscreen controller is operable to determine a location of a touch or proximity of an object at or near said surface of said plastic substrate responsive to a detected change in capacitance.

2. The method according to claim 1, wherein said conductive layer comprises a transparent conductive material.

3. The method according to claim 2, wherein said transparent conductive material comprises a conductive and/or semiconductive material comprising at least one of tin oxide, silicon oxide, microcrystalline, polycrystalline or amorphous indium tin oxide (ITO), antimony tin oxide, zinc oxide, aluminum oxide, carbon nano-tube, microcrystalline, polycrystalline or amorphous carbon, and hydrogen, nitrogen, fluorine and phosphorus doped carbon.

4. The method according to claim 1, wherein said conductive layer comprises a metallic material.

5. The method according to claim 4, wherein said metallic material comprises an opaque or partially opaque or partially transparent metallic layer or coating, and wherein said metallic material comprises at least one of copper, chromium, niobium, neodymium, silver, molybdenum, and alloys thereof.

6. The method according to claim 4, wherein said metallic material is at least one of (a) disposed on said surface of said plastic substrate and (b) disposed over a transparent conductive material disposed on said surface of said plastic substrate.

7. The method according to claim 1, wherein said conductive layer is disposed on at least one of a front surface of said plastic substrate and a rear surface of said plastic substrate.

8. The method according to claim 1, wherein said conductive layer comprises a transparent conductive material and a metallic material.

9. The method according to claim 8, wherein said transparent conductive material and said metallic material are at least one of (a) disposed on the same surface of said plastic substrate and (b) disposed on opposite surfaces of said plastic substrate.

10. The method according to claim 1, wherein said conductive layer comprises a transparent conductive material prepared by a means of thin film preparation, said preparation comprising at least one of direct current magnetron sputtering, radio frequency magnetron sputtering, chemical vapor deposition, physical vapor deposition, electron beam evaporation, pulsed laser deposition and spray pyrolysis.

11. The method according to claim 1, wherein said plastic substrate comprises a polymer material comprising at least one of cyclic olefin, cyclic olefin resins (COC), cyclo olefin polymer (COP), polyolefin, polycarbonate, polyethylene terephthalate, acrylic, polyamide, polyimide, polystyrene, polysulfone, polyvinyl chloride, nylon, polyethylene, polypropylene and polyvinyl alcohol.

12. The method according to claim 1, wherein said capacitive touchscreen device is operable to detect the presence and location of a touch within a device area by detecting a capacitance variation.

13. The method according to claim 1, wherein said etchant paste comprises a caustic etching paste.

14. The method according to claim 1, wherein said etchant paste comprises an acidic or basic paste.

15. The method according to claim 1, wherein said etchant paste comprises a natural or synthetic etching paste.

16. The method according to claim 1, wherein said etchant paste is applied selectively to a major surface of said conductive layer to form a pattern of applied paste.

17. The method according to claim 1, wherein said etchant paste is applied to said portions of said conductive layer by a selective deposition method.

18. The method according to claim 17, wherein said selective deposition method comprises screen printing.

19. The method according to claim 1, wherein said conductive layer is part of said capacitive touchscreen device and said doped region is part of said capacitive touchscreen device.

20. The method according to claim 1, wherein said conductive layer has major surfaces and edges and said etchant paste is applied at least to said edges of said conductive layer.

21. The method according to claim 1, wherein said thermal processing step comprises a treatment performed at one of (a) room temperature and (b) an elevated temperature below a glass transition temperature of said plastic substrate.

22. The method according to claim 21, wherein said treatment includes exposing said substrate to at least one of infra red light, ultra violet light, visible light and no light.

23. The method according to claim 1, wherein rinsing said etched substrate comprises rinsing via a dip or spray process, with or without agitation ultrasonic wave using water or using a solvent comprising at least one of methanol, ethanol, acetone, iso-propanol and combinations thereof.

24. The method according to claim 1, wherein said plastic substrate has a thickness of at least about 0.5 mm.

25. The method according to claim 1, wherein said temperature to thermally activate said etchant paste in the thermal processing step is kept at substantially constant value.

26. The method according to claim 1, wherein said conductive layer is directly disposed on said surface of said plastic substrate.

* * * * *